US012809208B2

(12) United States Patent
Park et al.

(10) Patent No.: US 12,809,208 B2
(45) Date of Patent: Nov. 24, 2026

(54) DISPLAY DEVICE

(71) Applicant: LG Display Co., Ltd., Seoul (KR)

(72) Inventors: Hyejeong Park, Jeonju-si (KR); Hongseok Heo, Paju-si (KR); Yonghee Han, Jeonju-si (KR); Jonggun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 359 days.

(21) Appl. No.: 18/535,393

(22) Filed: Dec. 11, 2023

(65) Prior Publication Data

US 2024/0210751 A1 Jun. 27, 2024

(30) Foreign Application Priority Data

Dec. 27, 2022 (KR) ........................ 10-2022-0185215

(51) Int. Cl.

| | |
|---|---|
| ***G02F 1/1335*** | (2006.01) |
| ***G02B 5/30*** | (2006.01) |
| ***G02F 1/13363*** | (2006.01) |
| ***H10K 50/80*** | (2023.01) |
| ***H10K 50/86*** | (2023.01) |

(52) U.S. Cl.

CPC ..... *G02F 1/133528* (2013.01); *G02B 5/3008* (2013.01); *G02B 5/3033* (2013.01); *G02F 1/133633* (2021.01); *H10K 50/865* (2023.02); *H10K 50/868* (2023.02)

(58) Field of Classification Search

CPC ............ G02F 1/133528; G02B 5/3025; G02B 5/3033; H10K 50/868; H10K 50/865

See application file for complete search history.

(56) References Cited

U.S. PATENT DOCUMENTS

| | | | | |
|---|---|---|---|---|
| 10,591,768 | B2 | 3/2020 | Yoon et al. | |
| 2016/0238885 | A1 | 8/2016 | Shan et al. | |
| 2016/0238892 | A1 | 8/2016 | Liu et al. | |
| 2016/0372701 | A1 | 12/2016 | Kwon et al. | |
| 2020/0117042 | A1* | 4/2020 | Park .................. | G02F 1/133528 |

FOREIGN PATENT DOCUMENTS

| | | | | |
|---|---|---|---|---|
| CN | 101051143 | A | 10/2007 | |
| CN | 102364563 | A | 2/2012 | |
| CN | 104635374 | A | 5/2015 | |
| CN | 106257680 | A | 12/2016 | |
| KR | 20120067868 | A * | 6/2012 | ....... G02F 1/133528 |
| KR | 20170063289 | A * | 6/2017 | ....... G02F 1/133528 |
| KR | 20210053663 | A * | 5/2021 | ............. G02B 26/08 |
| KR | 102377174 | B1 | 3/2022 | |

* cited by examiner

*Primary Examiner* — Jia X Pan

(74) *Attorney, Agent, or Firm* — Seed Intellectual Property Law Group LLP

(57) ABSTRACT

The present disclosure relates to a display device. A display device includes a display panel including a display area and a non-display area, a polarization layer disposed on the display panel, and a light control layer. The polarization layer has a light transmission axis extending in a first direction. The light control layer includes a light-transmissive portion overlapping the display area of the display panel and a light-blocking portion overlapping the non-display area of the display panel. The light-blocking portion has a light transmission axis extending in a second direction different from the first direction.

21 Claims, 7 Drawing Sheets

100

DISPLAY DEVICE

CROSS-REFERENCE TO RELATED APPLICATION

This application claims priority from Korean Patent Application No. 10-2022-0185215 filed on Dec. 27, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a display device. More specifically, the present disclosure relates to a display device capable of reducing a difference between reflection color of a display area and reflection color of a non-display area.

Description of the Related Art

There are various types of display devices that display images, such as a liquid crystal display device (LCD), an organic light-emitting diode display device (OLED), an inorganic light-emitting diode display device (ILED), a quantum dot display device (QD), and an electrophoretic display device (EPD).

A polarization layer is provided on a display panel of a display device to reduce external light reflection. Further, in order to screen or shield various lines disposed in a non-display area of the display panel, a black matrix is disposed or coated on a cover window, or a separate decorative film having the black matrix disposed or coated thereon is disposed between the cover window and the display panel.

The description provided in the background section should not be assumed to be prior art merely because it is mentioned in or associated with the background section. The background section may include information that describes one or more aspects of the subject technology.

BRIEF SUMMARY

As newly recognized by the inventors of the present disclosure, when the black matrix is disposed or coated on the non-display area of the cover window or the separate decorative film having the black matrix disposed or coated thereon is disposed under the cover window, a difference between reflection color or black color of the non-display area and reflection color or black color of the display area of the display device occurs. As a result, a user may feel a sense of difference between the display area and the non-display area.

Therefore, the inventors of the present disclosure recognized the limitations mentioned above and other limitations associated with the related art, and conducted various experiments to implement a display device capable of reducing a difference between reflection color or black color of a display area and reflection color or black color of a non-display area.

An aspect of the present disclosure is to provide a display device capable of reducing a difference between reflection color or black color of a display area and reflection color or black color of a non-display area.

Another aspect of the present disclosure is to provide a display device capable of controlling (for example, narrowing) viewing angles of the display device to provide privacy protection.

Aspects according to the present disclosure are not limited to the above-mentioned aspect. Other features and aspects according to the present disclosure that are not mentioned may be understood based on following descriptions and in part will become apparent from the description or may be learned by practice of the inventive concepts provided herein, and may be more clearly understood based on example embodiments according to the present disclosure. Further, it will be easily understood that the features and aspects according to the present disclosure may be realized using means shown in the claims or combinations thereof.

In an example embodiment of the present disclosure, a display device includes a display panel including a display area and a non-display area; a light control layer disposed over the display panel; a polarization layer disposed between the display panel and the light control layer, wherein the polarization layer has a light transmission axis extending in a first direction, wherein the light control layer includes: a light-transmissive portion overlapping the display area of the display panel; and a light-blocking portion overlapping the non-display area of the display panel, wherein the light-blocking portion has a light transmission axis extending in a second direction different from the first direction.

In another example embodiment of the present disclosure, a display device includes a display panel including a display area and a non-display area; a light control layer disposed over the display panel; a polarization layer disposed between the display panel and the light control layer, wherein the light control layer includes reactive mesogen and dichroic dye, wherein the light control layer includes: a light-transmissive portion overlapping the display area of the display panel; and a light-blocking portion overlapping the non-display area of the display panel, wherein each of the light-transmissive portion and the light-blocking portion includes the reactive mesogen and the dichroic dye, wherein an orientation of each of the reactive mesogen and the dichroic dye of the light-blocking portion is different from an orientation of each of the reactive mesogen and the dichroic dye of the light-transmissive portion.

Details of other embodiments are included in the detailed descriptions and drawings.

According to the embodiments of the present disclosure, the light control layer disposed on the display panel includes the light-transmissive portion and the light-blocking portion including the reactive mesogen and the dichroic dye with the same composition. Thus, the difference between the reflection color or black color of the display area of the display device and the reflection color or black color of the non-display area may be reduced.

According to the embodiments of the present disclosure, the light control layer disposed on the display panel may include the light-transmissive portion including the reactive mesogen and the dichroic dye oriented in the direction perpendicular to the upper surface of the polarization layer. Thus, the viewing angle of the display device may be narrowed, such that the privacy thereof may be protected. When the display device is applied to a vehicle display device, reflection of the screen of the display device from the windshield of the vehicle may be prevented or reduced.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, that may be included to provide a further understanding of the disclosure and may be incorporated in and constitute a part of the disclosure, illustrate embodiments of the disclosure and together with the description serve to explain various principles of the disclosure.

Figure 1:
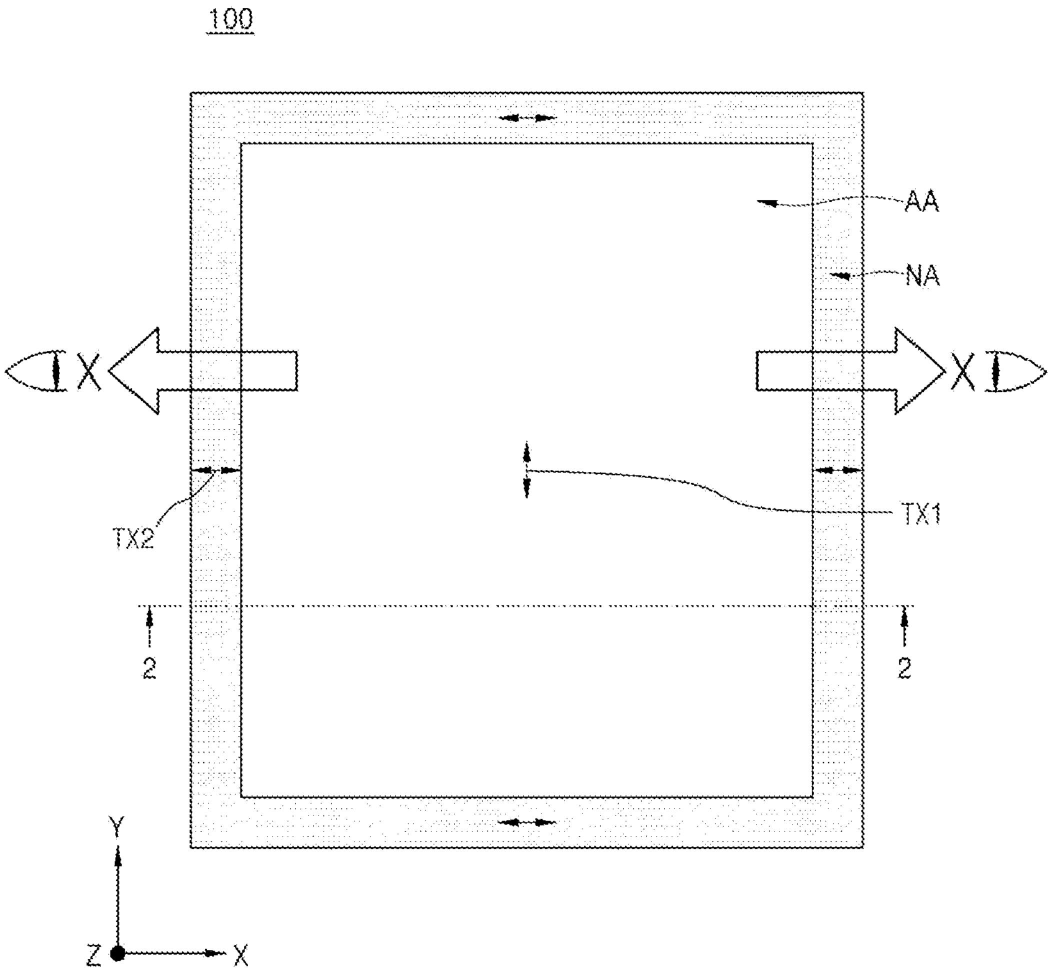
FIG. 1 is a plan view showing a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps or operations is not limited to that set forth herein and may be changed as is known in the art, with the exception of steps or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and a method of achieving the advantages and features will become apparent with reference to example embodiments described later in detail together with the accompanying drawings. However, the present disclosure is not limited to the example embodiments as disclosed later, but may be implemented in various different forms. Thus, these embodiments are set forth only to make the present disclosure sufficiently thorough and complete, and to completely inform the scope of the present disclosure to those of ordinary skill in the technical field to which the present disclosure belongs. Further, the protected scope of the present disclosure is defined by claims and their equivalents.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted or may be briefly provided for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the technical idea and scope of the present disclosure as defined by the appended claims.

The shapes, sizes, dimensions (e.g., length, width, height, thickness, radius, diameter, area, etc.), ratios, angles, number of elements, and the like, which are illustrated in the drawings for describing various example embodiments of the present disclosure are illustrative and are merely given by way of example, and the present disclosure is not limited thereto. The same reference numerals refer to the same elements herein. Further, descriptions and details of well-known steps and elements are omitted or may be briefly provided for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Any implementation described herein as an "example" is not necessarily to be construed as preferred or advantageous over other implementations.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The terminology used herein is directed to the purpose of describing particular embodiments only and is not intended to be limiting of the present disclosure. As used herein, the singular constitutes "a" and "an" are intended to include the plural constitutes as well, and vice versa, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "next," "before," etc., another event may occur therebetween unless "directly after," "directly subsequent," "directly next to" or "directly before" is indicated.

When a certain embodiment may be implemented differently, a function or an operation specified in a specific block may occur in a different order from an order specified in a flowchart. For example, two blocks in succession may be performed, in part or in full, concurrently, or the two blocks may be performed in a reverse order depending on a function or operation involved.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the technical idea and scope of the present disclosure.

In describing elements of the present disclosure, the terms like "first," "second," "A," "B," "(a)," and "(b)," etc., may be used. These terms may be merely for differentiating one element from another element, and the essence, sequence, order, or number of the corresponding elements should not be limited by these terms. Also, when an element or layer is described as being "connected," "coupled," or "adhered" to another element or layer, the element or layer can not only be directly connected, or adhered to that other element or layer, but also be indirectly connected, or adhered to that other another element or layer with one or more intervening elements or layers "disposed" between the elements or layers, unless otherwise specified.

The features of the various embodiments of the present disclosure may be partially or entirely combined with each other, and may be technically associated with each other or operate with each other. The embodiments may be implemented independently or may be implemented together in association.

A numerical value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects," and the like should not be construed such that any aspect or design as described is superior to or advantageous over other aspects or designs.

Further, the term 'or' means 'inclusive or' rather than 'exclusive or.'

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Description.

Hereinafter, display devices according to example embodiments of the present disclosure will be described in detail with reference to the accompanying drawings.

Figure 2:
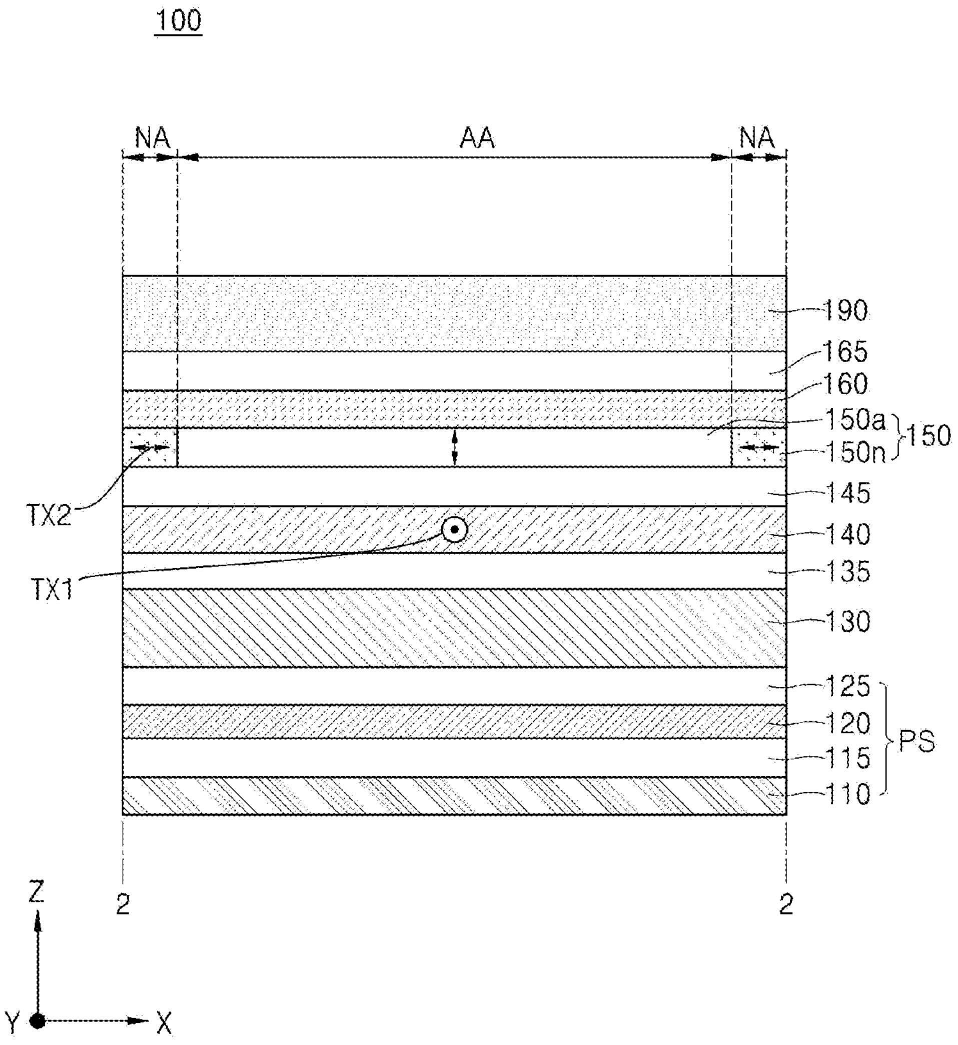
FIG. 2 is a cross-sectional view taken along line 2-2 of FIG. 1, showing a display device according to an example embodiment of the present disclosure.

FIG. 1 is a plan view showing a display device 100 according to an example embodiment of the present disclosure. FIG. 2 is a cross-sectional view taken along line 2-2 of FIG. 1, showing the display device 100 according to an example embodiment of the present disclosure.

Referring to FIG. 1 and FIG. 2, the display device 100 according to an example embodiment of the present disclosure may include a display area AA and a non-display area NA. The display area AA may be an area where an image is displayed. The non-display area NA may be disposed adjacent to or around the display area AA and may be an area in which an image is not displayed. The non-display area NA may be a bezel area. The display area AA and the non-display area NA may be equally applied to each of components of the display device 100. For example, a display panel 130 may have a display area AA and a non-display area NA.

The display device 100 according to an example embodiment of the present disclosure includes a support structure PS, the display panel 130, a polarization layer 140, a light control layer 150, a base film 160, and a cover window 190.

The cover window 190 may protect the display panel 130, the polarization layer 140, the light control layer 150, and the like from external impact, moisture, or heat.

The cover window 190 may be made of a tempered glass film or a plastic film having impact resistance and light transmission in order to protect the display panel 130 from external impact, moisture, or heat. To provide improved strength characteristics and folding characteristics in one embodiment, the cover window 190 may be formed to have a thickness of 30 to 200 μm, but the present disclosure is not limited thereto.

When the cover window 190 is made of the plastic film, the plastic film may include polyimide (PI), polyethylene terephthalate (PET), polypropylene glycol (PPG), or polycarbonate (PC). However, the present disclosure is not limited thereto. A hard coating layer may be formed on the cover window 190. The hard coating layer may include a transparent organic-inorganic composite material.

When the cover window 190 is made of the tempered glass, the cover window 190 may be broken by external force or stress. In this regard, in order to prevent or reduce fragments of the cover window 190 from scattering, a protective film may be attached to an upper surface of the cover window 190 via an adhesive layer. The protective film may include, for example, polyethylene terephthalate (PET), colorless polyimide (CPI), or a laminate of polyethylene terephthalate (PET) and colorless polyimide (CPI). Further, a hard coating layer may be formed on the protective film. The hard coating layer may include a transparent organic-inorganic composite material.

The polarization layer 140 may be disposed on the display panel 130 to prevent or reduce reflection of light introduced from outside to improve visibility of the display panel 130. In this embodiment, the polarization layer 140 may have a light transmission axis TX1 extending in a first direction (e.g., a Y-axis direction) parallel to an upper surface of the polarization layer 140. A phase retardation layer may be further included between the polarization layer 140 and the display panel 130.

The light control layer 150 may be disposed over the display panel 130, for example, between the polarization layer 140 and the cover window 190.

The light control layer 150 may be disposed on a lower surface of the base film 160. The light control layer 150 may be directly formed or coated on the lower surface of the base film 160.

The base film 160 may be attached to a lower surface of the cover window 190 via an adhesive layer 165. The light control layer 150 may be attached to an upper surface of the polarization layer 140 via an adhesive layer 145. The polarization layer 140 may be attached to an upper surface of the display panel 130 via an adhesive layer 135. Each of the adhesive layers 135, 145 and 165 may be an adhesive member including an optical clear adhesive, an optical clear resin, or the like. The base film 160 may include a transparent material.

In an example embodiment, the light control layer 150 may be disposed on an upper surface of the base film 160.

The light control layer 150 may include a light-transmissive portion **150*a* overlapping the display area AA of the display panel 130 and a light-blocking portion 150*n* overlapping the non-display area NA of the display panel 130. The light-blocking portion 150*n* may prevent or alleviate various lines disposed in the non-display area NA of the display panel 130** from being viewed to the user.

The light control layer 150 may include reactive mesogen and dichroic dye. The reactive mesogen in a polymerized form may be included in the light control layer 150.

In an embodiment, the reactive mesogen may be preferably a smectic reactive mesogen. When the smectic reactive mesogen is used, the reactive mesogen may be easily oriented in a direction perpendicular to the upper surface of the polarization layer 140 without a separate alignment layer.

The dichroic dye may absorb at least a portion or an entirety of a wavelength range of the visible light. For example, the dichroic dye may include a first dye having a maximum absorption wavelength of 300 to 450 nm, a second dye having a maximum absorption wavelength of 450 to 600 nm, and a third dye having a maximum absorption wavelength of 600 to 750 nm. The dichroic dye may include a combination of dyes of various maximum absorption wavelengths to render a black color. The dichroic dye may include at least one selected from azo-based dye, anthraquinone-based dye, phthalocyanine-based dye, and porphyrin azo dye.

As described below with reference to FIG. 4, the light-transmissive portion **150*a* and the light-blocking portion 150*n* of the light control layer 150 may be formed for example by coating and curing one composition on one surface of the base film 160. Thus, the light-transmissive portion 150*a* and the light-blocking portion 150*n* of the light control layer 150 may have the same components. The light-transmissive portion 150*a* and the light-blocking portion 150*n* of the light control layer 150 may include the reactive mesogen and the dichroic dye at the same composition. Accordingly, the display area AA and the non-display area NA of the display device 100** may exhibit the same reflection color or black color.

However, the light-blocking portion **150*n* of the light control layer 150 may have the reactive mesogen oriented in a direction different from a direction in which the reactive mesogen of the light-transmissive portion 150*a* of the light control layer 150 is oriented. Accordingly, the dichroic dye in the light-blocking portion 150*n* of the light control layer 150 may also be oriented in a direction different from a direction in which the dichroic dye in the light-transmissive portion 150*a* of the light control layer 150** is oriented.

In an embodiment, the light-transmissive portion **150*a* of the light control layer 150 may include the reactive mesogen oriented in a third direction (e.g., Z-axis direction) perpendicular to an upper surface of the polarization layer 140. The light-blocking portion 150*n* of the light control layer 150 may include the reactive mesogen oriented in the first direction (e.g., Y-axis direction) parallel to the upper surface of the polarization layer 140. Accordingly, the light-transmissive portion 150*a* of the light control layer 150 may include the dichroic dye oriented in the third direction (e.g., Z-axis direction) perpendicular to the upper surface of the polarization layer 140, while the light-blocking portion 150*n* of the light control layer 150 may include the dichroic dye oriented in the first direction (e.g., Y-axis direction) parallel to the upper surface of the polarization layer 140**.

In an embodiment, the light-transmissive portion 150*a* of the light control layer 150 includes the dichroic dye oriented in the third direction (e.g., Z-axis direction) perpendicular to the upper surface of the polarization layer 140 such that light emitted from the display panel 130 and transmitting through the polarization layer 140 may transmit through the light-transmissive portion 150*a* so as to be directed in the third direction (e.g., the Z-axis direction). Therefore, due to the light-transmissive portion 150*a* of the light control layer 150 according to the present embodiment, the light emitted from the display panel 130 can be recognized by a user in front of the display panel, while the light emitted from the display panel 130 is not viewed at a left and right viewing angle, for example, at a viewing angle inclined, for example, in the X-axis direction. For example, the light emitted from the display panel 130 may be maximally or increasingly screened at a viewing angle inclined by 45 degrees in the X-axis direction. This embodiment may be applied to a display device of, for example, a mobile phone or a laptop computer to provide a privacy protection function.

The light-blocking portion 150*n* of the light control layer 150 includes the dichroic dye oriented in the first direction (e.g., Y-axis direction) parallel to the upper surface of the polarization layer 140, such that the light-blocking portion 150*n* may absorb a polarization component parallel to the orientation direction of the dichroic dye, for example, the first direction (e.g., Y-axis direction), and may transmit through a polarization component perpendicular to the orientation direction of the dichroic dye, for example, the first direction (e.g., Y-axis direction). Therefore, the light-blocking portion 150*n* of the light control layer 150 may have a light transmission axis TX2 extending in a second direction (e.g., X-axis direction) parallel to the upper surface of the polarization layer 140, and may have a light absorption axis extending in the first direction (e.g., Y-axis direction) parallel to the upper surface of the polarization layer 140. The light-blocking portion 150*n* of the light control layer 150 has the light transmission axis TX2 perpendicular to the light transmission axis TX1 of the polarization layer 140, such that the light-blocking portion 150*n* of the light control layer 150 may block light reflected from the lines disposed in the non-display area NA of the display panel 130 and then transmitting through the polarization layer 140.

The display panel 130 may display an image. The display panel 130 may be flexible. For example, the display panel 130 may be embodied as an organic light-emitting diode display panel. However, the present disclosure is not necessarily limited thereto. The display panel 130 may be embodied as an inorganic light-emitting diode display panel, a liquid crystal display panel, an electrophoretic display panel, or the like.

Figure 3:
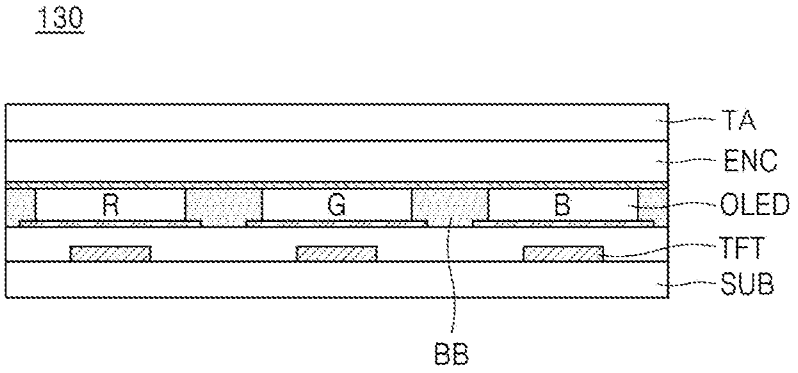
FIG. 3 is a schematic cross-sectional view of a display panel of a display device according to an example embodiment of the present disclosure.

Referring to FIG. 3, when the display panel 130 is embodied as, for example, an organic light-emitting diode display panel, the display panel 130 may include a thin-film transistor TFT disposed in each sub-pixel and on a flexible substrate SUB, an organic light-emitting element OLED disposed in each sub-pixel and connected to the thin-film transistor, and an encapsulation layer ENC that covers the organic light-emitting elements OLED so as to prevent or at least reduce the penetration of moisture and oxygen from the outside into the organic light-emitting elements OLED. In one example, each of the organic light-emitting elements OLED may be configured to emit each of red light, green light, and blue light in each sub-pixel, or may be configured to emit white light in each sub-pixel. But embodiments are not limited thereto. As an example, the organic light-emitting elements OLED may be configured to emit other colors such as cyan, magenta, yellow, etc., or a combination thereof. Each of the organic light-emitting elements OLED may include an anode electrode, an organic light-emitting layer, and a cathode electrode. The organic light-emitting elements OLED may be spaced apart from each other by a bank BB. The bank BB may cover a portion of a side end of the anode electrode. The bank BB may be embodied as a black bank containing black pigments or dyes. Further, the display panel 130 may further include a touch electrode array TA formed on the encapsulation layer ENC. When the organic light-emitting element OLED emits the white light, color filters R, G, and B may be formed on the touch electrode array TA, and a black matrix BM may be disposed between adjacent color filters. The black matrix BM may be disposed to overlap the bank BB and may have a width equal to or larger than that of the bank BB. However, the specific structure or arrangement of the display panel 130 is not limited to what shown in FIG. 3 and may be variously changed when desired. For example, the touch electrode array TA may be omitted.

The support structure PS may be disposed under the display panel 130 to support the display panel 130 and may dissipate heat generated from the display panel 130 to the outside.

The support structure PS may include a back plate 120 and a support plate 110. Further, the support structure PS may include an adhesive layer 115 disposed between the back plate 120 and the support plate 110, and an adhesive layer 125 disposed on the back plate 120.

The back plate 120 may be disposed below the display panel 130 and support the display panel 130. The display panel 130 applied to the foldable display device 100 may be very thin and flexible. The back plate 120 may prevent or reduce a foreign material from being attached to a lower surface of the display panel 130 and may reinforce rigidity of the display panel 130 and may absorb an impact applied from outside. The back plate 120 may be embodied as a polymer film. The polymer film which the back plate 120 may be embodied as may be made of, for example, polyimide, (PI), polyethylene terephthalate (PET), polycarbonate (PC), polyethylene naphthalate (PEN) acrylonitrile-butadiene-styrene copolymer (ABS), polymethyl methacrylate (PMMA), polyethersulfone (PES), polyarylate (PAR), polysulfone (PSF), cyclic olefin copolymer (COC), triacetylcellulose (TAC) film, polyvinyl alcohol (PVA) film, or polystyrene (PS), etc. However, the present disclosure is not limited thereto.

The adhesive layer 125 may be disposed between the back plate 120 and the display panel 130. The back plate 120 may be attached to the lower surface of the display panel 130 via the adhesive layer 125. The adhesive layer 125 may be transparent and may be made of a pressure-sensitive adhesive (PSA) including an optical clear adhesive (OCA), or an optically clear resin (OCR) or a heat-sealing adhesive (e.g., a heat-active type or a thermosetting type), but embodiments of the present disclosure are not limited thereto.

The support plate 110 may facilitate folding and unfolding of the display panel 130. The support plate 110 may dissipate the heat generated from the display panel 130 to the outside. The support plate 110 may be attached to the lower surface of the back plate 120 via the adhesive layer 115. The adhesive layer 115 may be transparent and may be made of a pressure-sensitive adhesive (PSA) including an optical clear adhesive (OCA), or an optically clear resin (OCR) or a heat-sealing adhesive (e.g., a heat-active type or a thermosetting type), but embodiments of the present disclosure are not limited thereto.

The support plate 110 may include at least one support plate and at least one adhesive layer. The support plate 110 may include a first support plate and a second support plate. The support plate 110 may further include an adhesive layer disposed between the first support plate and the second support plate. The first support plate may act as a lower support plate, and the second support plate may act as an upper support plate. The support plate 110 may also include a pattern of holes that may facilitate folding and unfolding of the display panel 130.

It is to be noted that the support structure PS shown in FIG. 2 is provided for illustrate purposed only, and the present disclosure is not limited thereto. For example, the support structure PS may be a single support film or be omitted from the display device according to example embodiments of the present disclosure. In addition, the specific structure of the display device shown in FIG. 2 is also provided by way of example, and the present disclosure is not limited thereto. For example, one or more layers shown in FIG. 2, such as the adhesive layers 135, 145 and 165, the base film 160, the cover window 190, or the support structure PS may be changed in position, omitted, or replaced by other elements, when appropriate.

Figure 4:
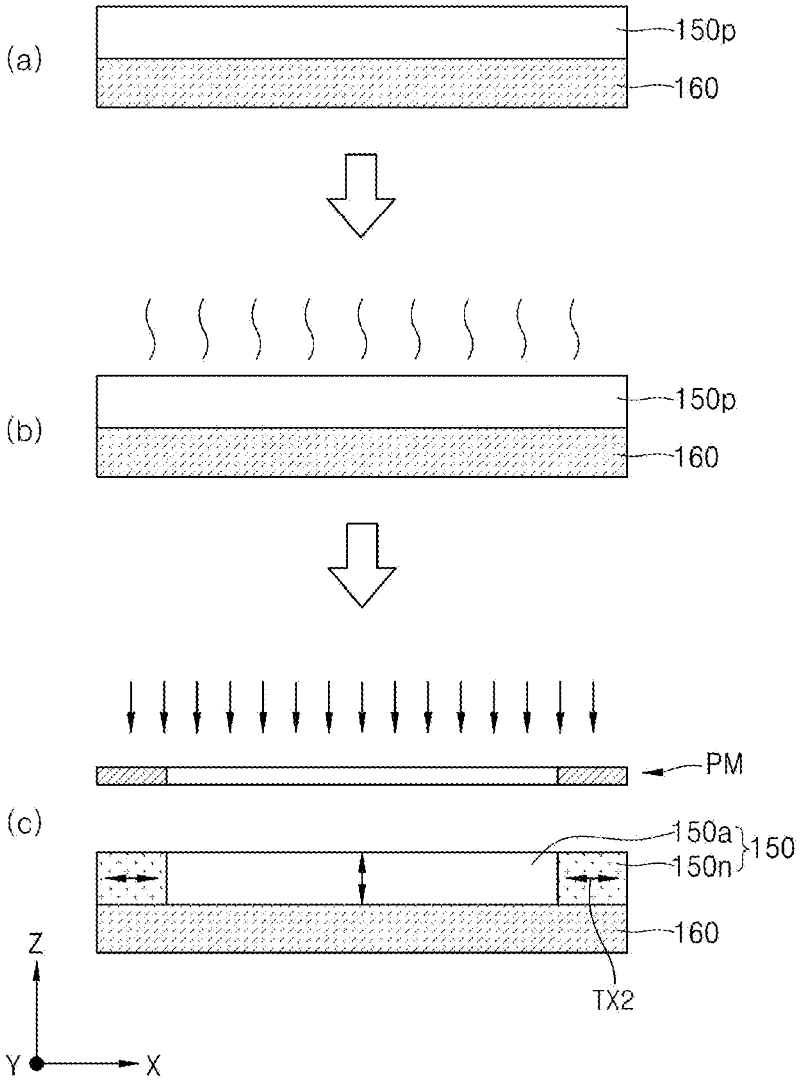
FIG. 4 is a cross-sectional view showing a method of forming a light control layer according to an example embodiment of the present disclosure.

FIG. 4 is a cross-sectional view of the steps showing a method of forming a light control layer according to an example embodiment of the present disclosure.

Referring to (a) in FIG. 4, a preliminary light control layer 150*p* may be formed by coating a composition including the smectic reactive mesogen, the dichroic dye, and photoinitiator on an entirety of one surface of the base film 160.

Referring to (b) in FIG. 4, solvent in the preliminary light control layer 150*p* may be dried.

Referring to (c) in FIG. 4, the dried preliminary light control layer 150*p* may be cured by irradiating ultraviolet rays thereto. At this time, using a mask PM having a polarization area in an outer area, unpolarized ultraviolet rays may be irradiated to an inner area of the preliminary light control layer 150*p* in which the light-transmissive portion 150*a* is to be formed, while linearly polarized ultraviolet light may be irradiated to an outer area of the preliminary light control layer 150*p* in which the light-blocking portion 150*n* is to be formed. In order to form the light control layer 150 as shown in FIGS. 1 and 2, ultraviolet rays linearly polarized, for example, in the X-axis direction, may be irradiated to the outer area of the preliminary light control layer 150*p* in which the light-blocking portion 150*n* is to be formed.

The unpolarized ultraviolet rays may be irradiated to the inner area of the composition 150*p* such that the smectic reactive mesogen may be polymerized while being oriented in the Z-axis direction perpendicular to one surface of the base film 160, and thus, the light-transmissive portion 150*a* may be formed. Depending on the orientation of the smectic reactive mesogen, the dichroic dye may also be oriented, for example, in the Z-axis direction.

The ultraviolet rays linearly polarized, for example, in the X-axis direction may be irradiated to the outer area of the composition 150*p* in which the light-blocking portion 150*n* is to be formed. Thus, the smectic reactive mesogen may be polymerized in a state in which the smectic reactive mesogen is oriented in the first direction (for example, Y-axis direction) parallel to one surface of the base film 160, such that the light-blocking portion 150*n* may be formed. Depending on the orientation of the smectic reactive mesogen, the dichroic dye may also be oriented, for example, in the Y-axis direction. Accordingly, the light-blocking portion 150*n* may have, for example, the light transmission axis TX2 extending in the X-axis direction and the light absorption axis extending in the Y-axis direction. However, the present disclosure is not limited thereto. For example, when ultraviolet rays linearly polarized, for example, in the Y-axis direction may be irradiated to the outer area of the composition 150*p* in which the light-blocking portion 150*n* is to be formed, the smectic reactive mesogen may be oriented in the second direction (for example, X-axis direction) parallel to one surface of the base film 160, and thus the dichroic dye may also be oriented, for example, in the X-axis direction. In this case, the light transmission axis of the polarization layer 140 may also be accordingly changed to implement the light-blocking portion 150*n*, which will be described hereinafter.

Figure 5:
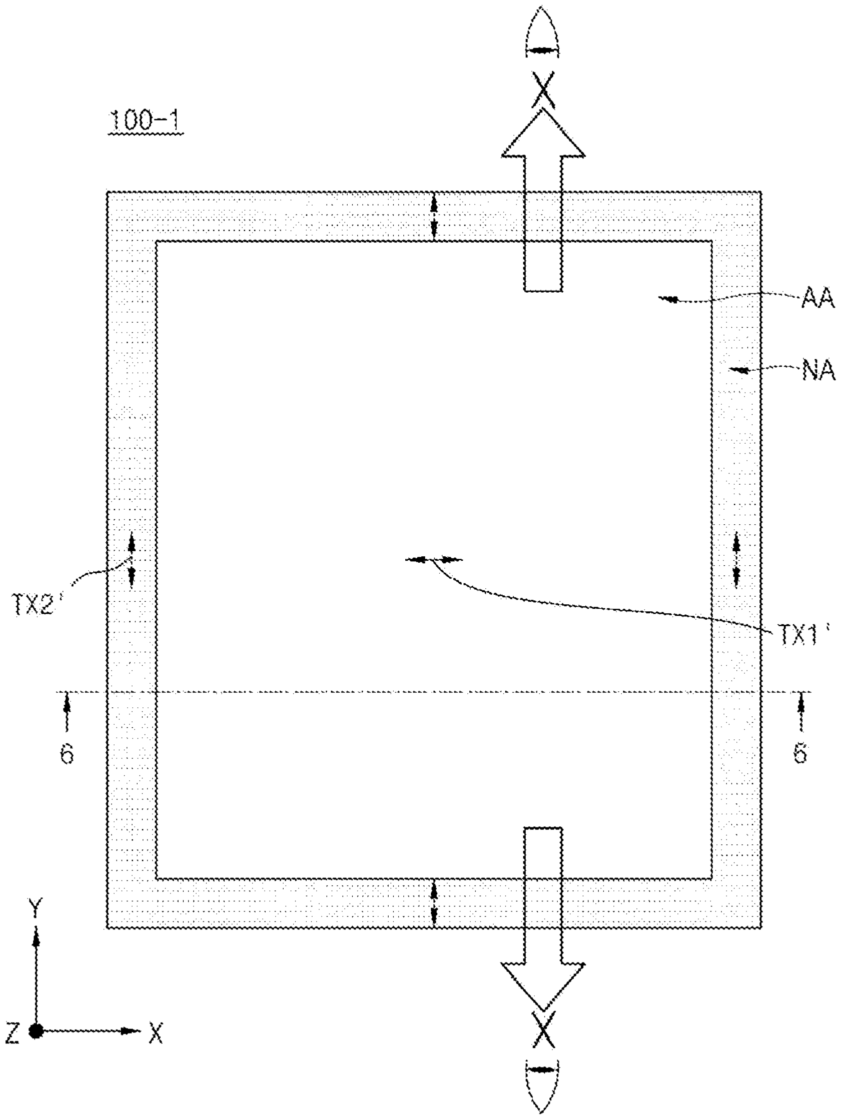
FIG. 5 is a plan view showing a display device according to an example embodiment of the present disclosure.
Figure 6:
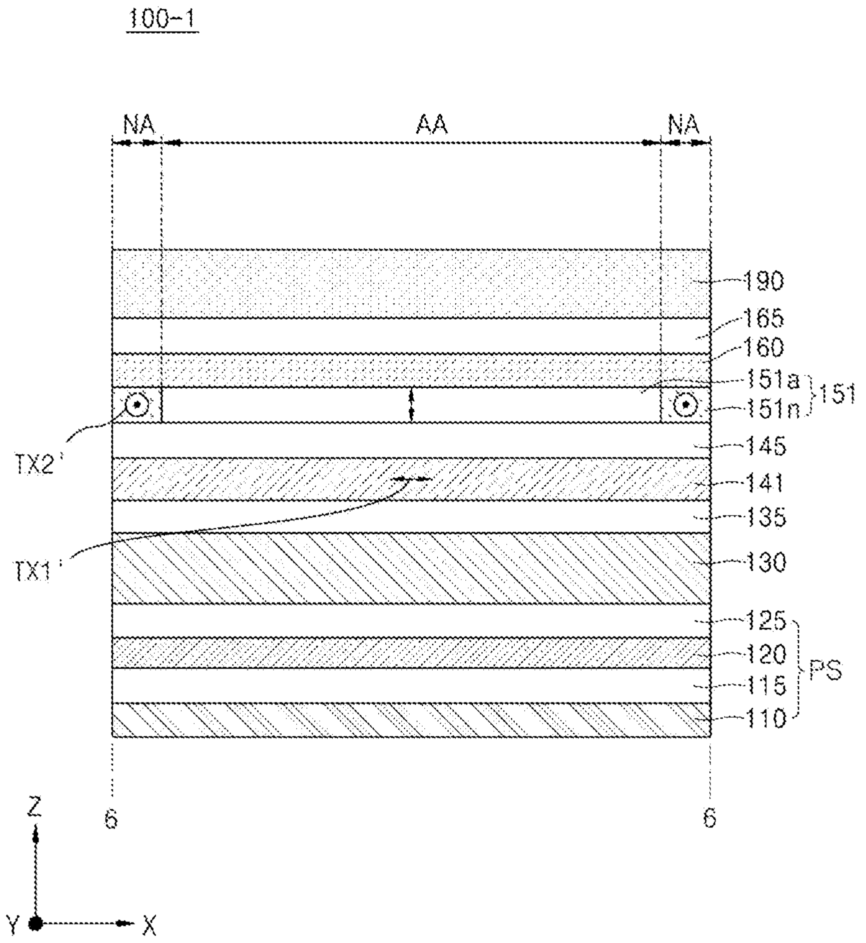
FIG. 6 is a cross-sectional view taken along line 6-6 of FIG. 5, showing a display device according to an example embodiment of the present disclosure.

FIG. 5 is a plan view showing a display device 100-1 according to an example embodiment of the present disclosure. FIG. 6 is a cross-sectional view taken along line 6-6 of FIG. 5, showing the display device 100-1 according to an example embodiment of the present disclosure. The display device 100-1 shown in FIGS. 5 and 6 is the same as the display device 100 shown in FIGS. 1 and 2 except for a polarization layer 141 and a light control layer 151. Therefore, in describing the display device 100-1 as shown in FIGS. 5 and 6, the same components thereof as those in the display device 100 shown in FIGS. 1 and 2 are briefly described or descriptions thereof are omitted.

Referring to FIG. 5 and FIG. 6, the display device 100-1 according to an example embodiment in the present disclosure includes the support structure PS, the display panel 130, the polarization layer 141, the light control layer 151, the base film 160, and the cover window 190.

The cover window 190 may protect the display panel 130, the polarization layer 141, the light control layer 151, and the like from external impact, moisture, or heat.

The polarization layer 141 may be disposed on the display panel 130 to prevent or at least reduce reflection of light introduced from the outside to improve visibility of the display panel 130. In this embodiment, the polarization layer 141 may have a light transmission axis TX1' extending in the second direction (e.g., the X-axis direction) parallel to the upper surface of the polarization layer 141. A phase retarder layer may be further included between the polarization layer 141 and the display panel 130.

The light control layer 151 may be disposed between the polarization layer 141 and the cover window 190.

The light control layer 151 may be disposed on the lower surface of the base film 160. The light control layer 151 may be directly formed or coated on the lower surface of the base film 160.

The base film 160 may be attached to the lower surface of the cover window 190 via the adhesive layer 165. The light control layer 151 may be attached to an upper surface of the polarization layer 141 via the adhesive layer 145. The polarization layer 141 may be attached to an upper surface of the display panel 130 via an adhesive layer 135.

Unlike what is shown in FIG. 6, in an example embodiment, the light control layer 151 may be disposed on the upper surface of the base film 160.

The light control layer 151 may include a light-transmissive portion 151*a* overlapping the display area AA of the display panel 130 and a light-blocking portion 151*n* overlapping the non-display area NA of the display panel 130.

The light-blocking portion 151*n* may prevent or alleviate various lines disposed in the non-display area NA of the display panel 130 from being viewed to the user.

The light control layer 151 may include the reactive mesogen, and the dichroic dye. The reactive mesogen in a polymerized form may be included in the light control layer 151.

In this embodiment, the reactive mesogen may be preferably the smectic reactive mesogen. When the smectic reactive mesogen is used, the reactive mesogen may be easily oriented in a direction perpendicular to the upper surface of the polarization layer 141 without a separate alignment layer.

The light-transmissive portion 151*a* and the light-blocking portion 151*n* of the light control layer 151 may be formed for example by coating and curing one composition on one surface of the base film 160. Thus, the light-transmissive portion 151*a* and the light-blocking portion 151*n* of the light control layer 151 may have the same components. The light-transmissive portion 151*a* and the light-blocking portion 151*n* of the light control layer 150 may include the reactive mesogen and the dichroic dye at the same composition. Accordingly, the display area AA and the non-display area NA of the display device 100-1 may exhibit the same reflection color or black color.

However, the light-blocking portion 151*n* of the light control layer 151 may have the reactive mesogen oriented in a direction different from a direction in which the reactive mesogen of the light-transmissive portion 151*a* of the light control layer 151 is oriented. Accordingly, the dichroic dye in the light-blocking portion 151*n* of the light control layer 151 may also be oriented in a direction different from a direction in which the dichroic dye in the light-transmissive portion 151*a* of the light control layer 151 is oriented.

In an embodiment, the light-transmissive portion 151*a* of the light control layer 151 may include the reactive mesogen oriented in the third direction (e.g., Z-axis direction) perpendicular to the upper surface of the polarization layer 141, while the light-blocking portion 151*n* of the light control layer 151 may include the reactive mesogen oriented in the second direction (e.g., X-axis direction) parallel to the upper surface of the polarization layer 141. Accordingly, the light-transmissive portion 151*a* of the light control layer 151 may include the dichroic dye oriented in the third direction (e.g., Z-axis direction) perpendicular to the upper surface of the polarization layer 141, while the light-blocking portion 151*n* of the light control layer 151 may include the dichroic dye oriented in the second direction (e.g., the X-axis direction) parallel to the upper surface of the polarization layer 141.

In an embodiment, the light-transmissive portion 151*a* of the light control layer 151 includes the dichroic dye oriented in the third direction (e.g., Z-axis direction) perpendicular to the upper surface of the polarization layer 141 such that light emitted from the display panel 130 and transmitting through the polarization layer 141 may transmit through the light-transmissive portion 151*a* so as to be directed in the third direction (e.g., the Z-axis direction). Therefore, due to the light-transmissive portion 151*a* of the light control layer 151 according to the present embodiment, the light emitted from the display panel 130 can be recognized by a user in front of the display panel 130, while the light emitted from the display panel 130 is not viewed at an upper and lower viewing angle, for example, at a viewing angle inclined, for example, in the Y-axis direction. For example, the light emitted from the display panel 130 may be increasingly screened at a viewing angle inclined by 45 degrees in the Y-axis direction. This embodiment may be applied to a vehicle display device such as a vehicle navigation device or other display devices utilized in the vehicle to prevent or at least reduce a screen of the vehicle display device from being reflected from a windshield of the vehicle.

The light-blocking portion 151*n* of the light control layer 151 may include the dichroic dye oriented in the second direction (e.g., X-axis direction) parallel to the upper surface of the polarization layer 141, such that the light-blocking portion 151*n* may absorb a polarization component parallel to the orientation direction of the dichroic dye, for example, the second direction (e.g., X-axis direction), and may transmit through a polarization component perpendicular to the orientation direction of the dichroic dye, for example, the second direction (e.g., X-axis direction). Therefore, the light-blocking portion 151*n* of the light control layer 151 may have a light transmission axis TX2' extending in the first direction (e.g., Y-axis direction) parallel to the upper surface of the polarization layer 141, and may have a light absorption axis extending in the second direction (e.g., X-axis direction) parallel to the upper surface of the polarization layer 140. The light-blocking portion 151*n* of the light control layer 151 has the light transmission axis TX2' perpendicular to the light transmission axis TX1' of the polarization layer 141, such that the light-blocking portion 151*n* of the light control layer 151 may block light reflected from the lines disposed in the non-display area NA of the display panel 130 and then transmitting through the polarization layer 141.

The display panel 130 may display an image. The display panel 130 may be flexible.

The support structure PS may be disposed under the display panel 130 to support the display panel 130 and may dissipate the heat generated from the display panel 130 to the outside.

The support structure PS may include the back plate 120 and the support plate 110. Further, the support structure PS may include the adhesive layer 115 disposed between the back plate 120 and the support plate 110, and the adhesive layer 125 disposed on the back plate 120.

Figure 7:
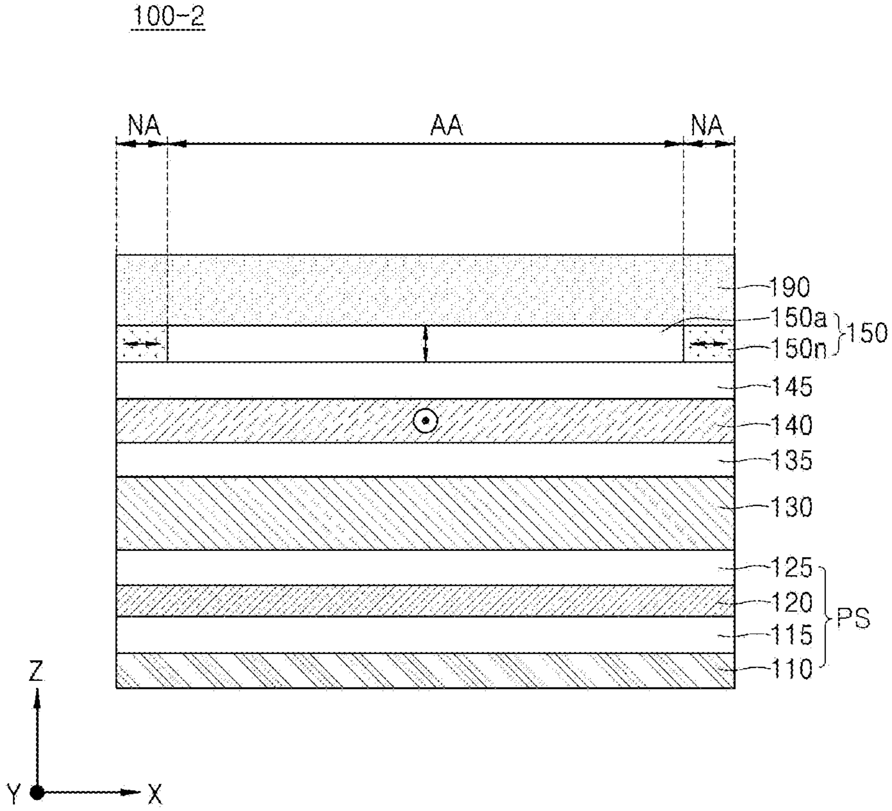
FIG. 7 is a cross-sectional view illustrating a display device according to an example embodiment of the present disclosure

FIG. 7 is a cross-sectional view showing a display device 100-2 according to an example embodiment of the present disclosure.

Referring to FIG. 7, the light control layer 150 may be directly disposed on the lower surface of the cover window 190 while the base film 160 may be absent.

The light control layer 150 may be disposed between the polarization layer 140 and the cover window 190. Thus, the display area AA and the non-display area NA of the display device 100-2 according to the present embodiment may exhibit the same reflection color or black color. In addition, the display device 100-2 according to the present disclosure may have a privacy protection function via control of the viewing angle. In particular, as shown in FIG. 7, the light-blocking portion 150*n* of the light control layer 150 has a light transmission axis (e.g., X-axis direction parallel to the upper surface of the polarization layer 140) perpendicular to the light transmission axis (e.g., Y-axis direction parallel to the upper surface of the polarization layer 140) of the polarization layer 140, such that the light-blocking portion 150*n* of the light control layer 150 may block light reflected from the lines disposed in the non-display area NA of the display panel 130 and then transmitting through the polarization layer 140.

Figure 8:
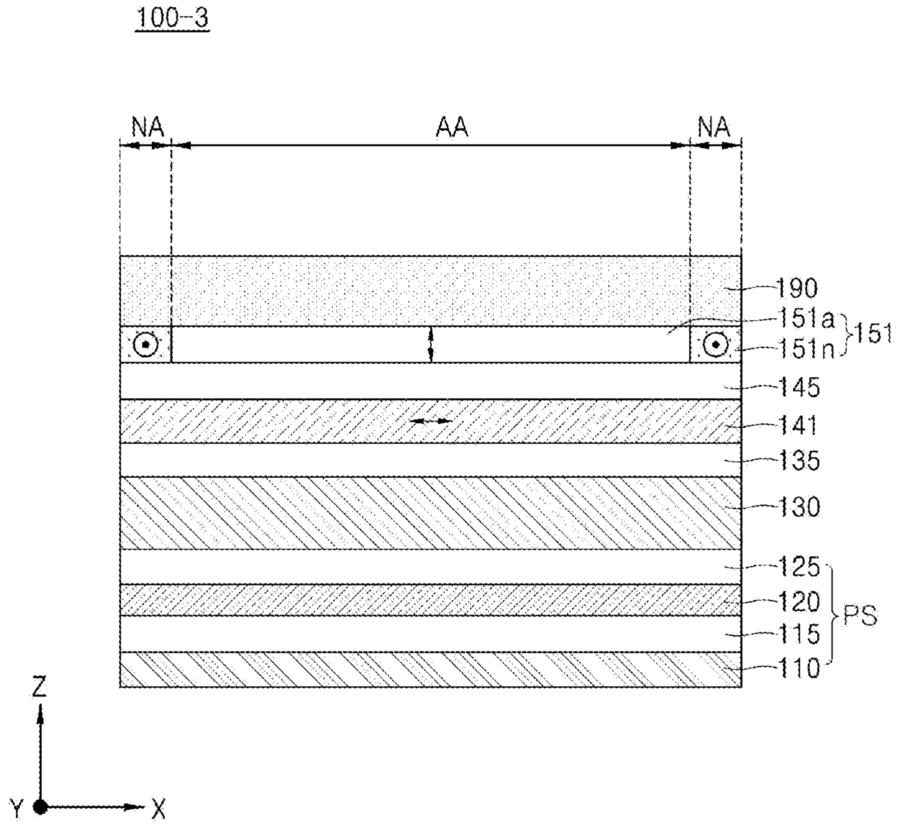
FIG. 8 is a cross-sectional view illustrating a display device according to an example embodiment of the present disclosure.

FIG. 8 is a cross-sectional view showing a display device 100-3 according to an example embodiment of the present disclosure.

Referring to FIG. 8, in this embodiment, the light control layer 151 may be directly disposed on the lower surface of the cover window 190 while the base film 160 may be absent.

The light control layer 151 may be between the polarization layer 141 and the cover window 190. Thus, the display area AA and the non-display area NA of the display device 100-2 according to the present embodiment may exhibit the same reflection color or black color. In addition, the display device 100-2 according to the present embodiment may be applied to the vehicle display device such as the vehicle navigation device or other display devices utilized in the vehicle to prevent or at least reduce the screen of the vehicle display device from being reflected from the windshield of the vehicle via the viewing angle control. In particular, as shown in FIG. 8, the light-blocking portion 151*n* of the light control layer 151 has the light transmission axis (e.g., Y-axis direction parallel to the upper surface of the polarization layer 141) perpendicular to the light transmission axis (e.g., X-axis direction parallel to the upper surface of the polarization layer 141) of the polarization layer 141, such that the light-blocking portion 151*n* of the light control layer 151 may block light reflected from the lines disposed in the non-display area NA of the display panel 130 and then transmitting through the polarization layer 141.

In the above-described embodiments, the example in which each of the light transmission axes TX1 and TX1' of the polarization layers 140 and 141 is oriented in the X-axis direction or the Y-axis direction, while each of the light transmission axes TX2 and TX2' of the light-blocking portions of the light control layers 150 and 151 is oriented in the Y-axis direction or the X-axis direction in a manner perpendicular to each of the light transmission axes TX1 and TX1' of the polarization layers 140 and 141 has been descried above. However, the present disclosure is not limited thereto.

For example, in another embodiment, each of the light transmission axes TX1 and TX1' of the polarization layers 140 and 141 may be oriented in a direction of 45 degrees with respect to the X-axis direction, while each of the light transmission axes TX2 and TX2' of the light-blocking portions of the light control layers 150 and 151 may be oriented in a direction of 135 degrees with respect to the X-axis direction.

In still another embodiment, each of the light transmission axes TX1 and TX1' of the polarization layers 140 and 141 may be oriented in a direction of 135 degrees with respect to the X-axis direction, while each of the light transmission axes TX2 and TX2' of the light-blocking portions of the light control layers 150 and 151 may be oriented in a direction of 45 degrees with respect to the X-axis direction. In other embodiments of the present disclosure, the each of the light transmission axes TX1 and TX1' of the polarization layers 140 and 141 may be oriented in a direction different from each of the light transmission axes TX2 and TX2' of the light-blocking portions of the light control layers 150 and 151. For example, there may be an angle formed between each of the light transmission axes TX1 and TX1' of the polarization layers 140 and 141 and each of the light transmission axes TX2 and TX2' of the light-blocking portions of the light control layers 150 and 151, and when this angle is larger than a predetermined value (for example, 60 degrees) and equal to or less than 90 degrees, light reflected from the lines disposed in the non-display area NA of the display panel 130 and then transmitting through the polarization layer may be substantially blocked or shielded by the light-blocking portion.

A display device according to example embodiments of the present disclosure may be described as follows.

A first aspect of the present disclosure provides a display device comprising: a display panel including a display area and a non-display area; a light control layer disposed over the display panel; and a polarization layer disposed between the display panel and the light control layer, wherein the polarization layer has a light transmission axis extending in a first direction, wherein the light control layer includes: a light-transmissive portion overlapping the display area of the display panel; and a light-blocking portion overlapping the non-display area of the display panel, wherein the light-blocking portion has a light transmission axis extending in a second direction different from the first direction.

In some implementations of the first aspect of the present disclosure, the second direction is perpendicular to the first direction.

In some implementations of the first aspect of the present disclosure, both the first direction and the second direction are parallel to an upper surface of the polarization layer In some implementations of the first aspect of the present disclosure, the light control layer includes reactive mesogen and dichroic dye.

In some implementations of the first aspect of the present disclosure, each of the light-transmissive portion and the light-blocking portion includes the reactive mesogen and the dichroic dye, wherein a composition of the light-transmissive portion and a composition of the light-blocking portion are identical with each other.

In some implementations of the first aspect of the present disclosure, each of the light-transmissive portion and the light-blocking portion includes the reactive mesogen and the dichroic dye, wherein an orientation of each of the reactive mesogen and the dichroic dye of the light-blocking portion is different from an orientation of each of the reactive mesogen and the dichroic dye of the light-transmissive portion.

In some implementations of the first aspect of the present disclosure, each of the reactive mesogen and the dichroic dye of the light-blocking portion is oriented in the first direction.

In some implementations of the first aspect of the present disclosure, each of the reactive mesogen and the dichroic dye of the light-transmissive portion is oriented in a third direction perpendicular to an upper surface of the polarization layer.

In some implementations of the first aspect of the present disclosure, the reactive mesogen includes smectic reactive mesogen.

In some implementations of the first aspect of the present disclosure, the dichroic dye includes a first dye having a maximum absorption wavelength of 300 to 450 nm, a second dye having a maximum absorption wavelength of 450 to 600 nm, and a third dye having a maximum absorption wavelength of 600 to 750 nm.

In some implementations of the first aspect of the present disclosure, the display device further comprises a cover window disposed on the light control layer.

In some implementations of the first aspect of the present disclosure, the display device further comprises a base film disposed between the polarization layer and the cover window, wherein the light control layer is directly disposed on one surface of the base film.

In some implementations of the first aspect of the present disclosure, the light control layer is directly disposed on a lower surface of the cover window.

In some implementations of the first aspect of the present disclosure, the display device further comprises a support structure disposed under the display panel.

A second aspect of the present disclosure provides a display device comprising: a display panel including a display area and a non-display area; a light control layer disposed over the display panel; and a polarization layer disposed between the display panel and the light control layer, wherein the light control layer includes reactive mesogen and dichroic dye, wherein the light control layer includes: a light-transmissive portion overlapping the display area of the display panel; and a light-blocking portion overlapping the non-display area of the display panel, wherein each of the light-transmissive portion and the light-blocking portion includes the reactive mesogen and the dichroic dye, wherein an orientation of each of the reactive mesogen and the dichroic dye of the light-blocking portion is different from an orientation of each of the reactive mesogen and the dichroic dye of the light-transmissive portion.

In some implementations of the second aspect of the present disclosure, each of the reactive mesogen and the dichroic dye of the light-blocking portion is oriented in a direction parallel to a light transmission axis of the polarization layer.

In some implementations of the second aspect of the present disclosure, each of the reactive mesogen and the dichroic dye of the light-transmissive portion is oriented in a direction perpendicular to an upper surface of the polarization layer.

In some implementations of the second aspect of the present disclosure, the reactive mesogen includes smectic reactive mesogen.

In some implementations of the second aspect of the present disclosure, the display device further comprises a cover window disposed on the light control layer.

In some implementations of the second aspect of the present disclosure, the display device further comprises a base film disposed between the polarization layer and the cover window, wherein the light control layer is directly disposed on one surface of the base film.

In some implementations of the second aspect of the present disclosure, the light control layer is directly disposed on a lower surface of the cover window.

Although the embodiments of the present disclosure have been described in more detail with reference to the accompanying drawings, the present disclosure is not necessarily limited to these embodiments, and may be modified in a various manner within the scope of the technical idea of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a display panel including a display area and a non-display area; a light control layer disposed over the display panel; and a polarization layer disposed between the display panel and the light control layer, wherein the polarization layer has a light transmission axis extending in a first direction, wherein the light control layer includes:

a light-transmissive portion overlapping the display area of the display panel; and a light-blocking portion overlapping the non-display area of the display panel, wherein the light-blocking portion has a light transmission axis extending in a second direction different from the first direction, wherein the light-transmissive portion has a light transmission axis oriented perpendicular to an upper surface of the polarization layer, and the light transmission axis of the light-blocking portion is oriented parallel to the upper surface of the polarization layer and perpendicular to the light transmission axis of the polarization layer.

2. The display device of claim 1, wherein the second direction is perpendicular to the first direction.

3. The display device of claim 1, wherein both the first direction and the second direction are parallel to the upper surface of the polarization layer.

4. The display device of claim 1, wherein the light control layer includes a reactive mesogen and a dichroic dye.

5. The display device of claim 4, wherein each of the light-transmissive portion and the light-blocking portion includes a composition of the reactive mesogen and the dichroic dye, wherein the composition of the light-transmissive portion and the composition of the light-blocking portion are identical with each other.

6. The display device of claim 4, wherein each of the light-transmissive portion and the light-blocking portion includes the reactive mesogen and the dichroic dye, wherein an orientation of each of the reactive mesogen and the dichroic dye of the light-blocking portion is different from an orientation of each of the reactive mesogen and the dichroic dye of the light-transmissive portion.

7. The display device of claim 6, wherein each of the reactive mesogen and the dichroic dye of the light-blocking portion is oriented in the first direction.

8. The display device of claim 6, wherein each of the reactive mesogen and the dichroic dye of the light-transmissive portion is oriented in a third direction perpendicular to the upper surface of the polarization layer.

9. The display device of claim 4, wherein the reactive mesogen includes smectic reactive mesogen.

10. The display device of claim 4, wherein the dichroic dye includes a first dye having a maximum absorption wavelength of 300 to 450 nm, a second dye having a maximum absorption wavelength of 450 to 600 nm, and a third dye having a maximum absorption wavelength of 600 to 750 nm.

11. The display device of claim 1, further comprising a cover window disposed on the light control layer.

12. The display device of claim 11, wherein the display device further comprises a base film disposed between the polarization layer and the cover window, wherein the light control layer is directly disposed on one surface of the base film.

13. The display device of claim 11, wherein the light control layer is directly disposed on a lower surface of the cover window.

14. The display device of claim 1, further comprising a support structure disposed under the display panel.

15. A display device comprising:

a display panel including a display area and a non-display area; a light control layer disposed over the display panel; and a polarization layer disposed between the display panel and the light control layer, wherein the light control layer includes a reactive mesogen and a dichroic dye, wherein the light control layer includes:

a light-transmissive portion overlapping the display area of the display panel; and a light-blocking portion overlapping the non-display area of the display panel, wherein each of the light-transmissive portion and the light-blocking portion includes the reactive mesogen and the dichroic dye, wherein an orientation of each of the reactive mesogen and the dichroic dye of the light-blocking portion is different from an orientation of each of the reactive mesogen and the dichroic dye of the light-transmissive portion, wherein the light-transmissive portion has a light transmission axis oriented perpendicular to an upper surface of the polarization layer, and the light-blocking portion has a light transmission axis oriented parallel to the upper surface of the polarization layer and perpendicular to a light transmission axis of the polarization layer.

16. The display device of claim 15, wherein each of the reactive mesogen and the dichroic dye of the light-blocking portion is oriented in a direction parallel to the light transmission axis of the polarization layer.

17. The display device of claim 15, wherein each of the reactive mesogen and the dichroic dye of the light-transmissive portion is oriented in a direction perpendicular to the upper surface of the polarization layer.

18. The display device of claim 15, wherein the reactive mesogen includes smectic reactive mesogen.

19. The display device of claim 15, further comprising a cover window disposed on the light control layer.

20. The display device of claim 19, wherein the display device further comprises a base film disposed between the polarization layer and the cover window, wherein the light control layer is directly disposed on one surface of the base film.

21. The display device of claim 19, wherein the light control layer is directly disposed on a lower surface of the cover window.

* * * * *